United States Patent
Bakkers et al.

(10) Patent No.: US 7,192,533 B2
(45) Date of Patent: Mar. 20, 2007

(54) METHOD OF MANUFACTURING NANOWIRES AND ELECTRONIC DEVICE

(75) Inventors: Erik Petrus Antonius Maria Bakkers, Eindhoven (NL); Freddy Roozeboom, Eindhoven (NL); Johannes Fransiscus Cornelis Maria Verhoeven, Eindhoven (NL); Paul Van Der Sluis, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 274 days.

(21) Appl. No.: 10/509,564

(22) PCT Filed: Mar. 23, 2003

(86) PCT No.: PCT/IB03/01217

§ 371 (c)(1), (2), (4) Date: Sep. 28, 2004

(87) PCT Pub. No.: WO03/083919

PCT Pub. Date: Oct. 9, 2003

(65) Prior Publication Data

US 2005/0236357 A1   Oct. 27, 2005

(30) Foreign Application Priority Data

Mar. 28, 2002 (EP) .................................. 02076280

(51) Int. Cl.
*C03C 25/68* (2006.01)

(52) U.S. Cl. ...................... 216/58; 216/2; 257/1; 257/9; 438/22; 385/16; 385/12

(58) Field of Classification Search .................... 216/2, 216/58; 257/1, 9; 438/22; 385/16, 12
See application file for complete search history.

(56) References Cited

FOREIGN PATENT DOCUMENTS

DE 0544408 * 6/1993
EP 0 544 408 6/1993

OTHER PUBLICATIONS

E. Giovine, Nanotechnology, vol. 12, pp. 132-135 (2001).*
Nassiopoulos, A G et al: "Electroluminescent Solid State Devices Based on Silicon Nanowires, Fabricated by Using Lithography and Etching Techniques" Thin Solid Fils, Elsevier-Sequois S.A. Lausanne, CH., vol. 297, No. 1-2, Apr. 1, 1997.
He et al: "Dispersion, Refinement, and Manupulation of Single Silicon Nanowires" Applied Physics Letters, vol. 80, No. 10, Mar. 11, 2002.

* cited by examiner

*Primary Examiner*—Nadine Norton
*Assistant Examiner*—Maki Angadi
(74) *Attorney, Agent, or Firm*—Adam L. Stroud; Peter Zawilski

(57) ABSTRACT

In the method, semiconductor substrates are etched to provide nanowires, said substrates comprising a first layer of a first material and a second layer of a second material with a mutual interface, which first and second materials are different. They may be different in the doping type. Alternatively, the main constituent of the material may be different, for example SiGe or SiC versus Si, or InP versus InAs. In the resulting nanowires, the interface is atomically sharp. The electronic devices having nanowires between a first and second electrode accordingly have very good electroluminescent and optoelectronic properties.

6 Claims, 3 Drawing Sheets

METHOD OF MANUFACTURING NANOWIRES AND ELECTRONIC DEVICE

Figure 1A:
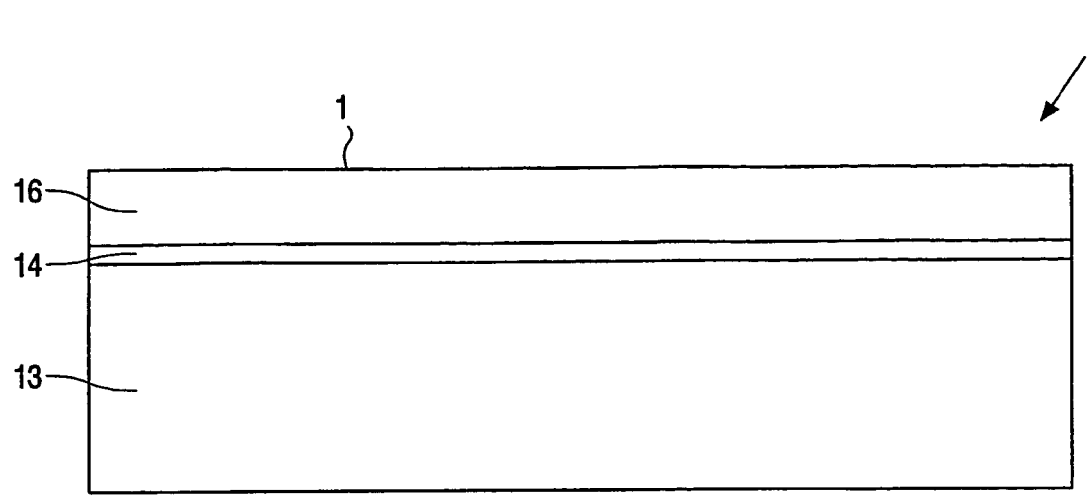

The invention relates to a method of manufacturing nanowires, comprising the steps of providing a patterned etching mask at a surface of a semiconductor substrate, and etching the semiconductor substrate so as to form nanowires in a direction substantially perpendicular to the surface of the semiconductor substrate, The invention also relates to a nanowire.

The invention further relates to an electronic device provided with a first and a second electrode which are interconnected via one or several nanowires.

Nanowires are wires of a usually semiconducting material with a diameter of less than 100 nm. They are regarded as building blocks for future electronic and optoelectronic elements. The nanowires have the advantage that dimensional restrictions owing to photolithographic patterning become less relevant. In addition, nanowires have properties different from those of units of the same material having larger dimensions because of quantization effects, such as a non-ohmic resistance.

A method as described in the opening paragraph is known from Liu et al., *J. Vac. Sci. Technol. B*, 11 (1993), 2532–2537. In the known method, a pattern is defined in an etching mask by means of e-beam lithography. This pattern is transferred to the semiconductor substrate by means of reactive ion etching. Since the pattern defines isolated regions which are to be protected against etching by the etching mask, nanowires are created in the semiconductor substrate. These nanowires have a diameter of 60 nm and a length of 10 µm. The outer shells of the nanowires are subsequently oxidized through heating to 800° C. The shells are then removed by etching in a bath of HF, and nanowires of 6 to 15 nm diameter remain.

It is a disadvantage of the method that the wires thus formed comprise no intrinsic functional elements.

It is a first object of the invention to provide a method by which such nanowires can be obtained.

This first object is achieved in that the semiconductor substrate comprises a first layer of a first material and a second layer of a second material, which layers adjoin one another; and etching takes place through the first and the second layer for forming the nanowires such that the nanowires comprise a first region of the first material and a second region of the second material.

Nanowires having one or several internal transitions—in axial direction along the nanowire—can be formed by the method according to the invention. A suitable incorporation of such internal transitions yields nanowires which are suitable for acting as more than merely a channel of a transistor. Such nanowires may, inter alia, emit light, serve as high-frequency rectifiers, or form quantum dot memories. They are known per se from Gudliksen et al., *Nature*, 415 (2002), 617–620.

It is a first advantage of the method according to the invention that the method is very simple and suitable for mass manufacture. The desired variations in material can be incorporated in or provided on the semiconductor substrate before the nanowires are made by etching. A few billions of nanowires can subsequently be obtained from a single semiconductor substrate of 150 mm.

It is a second advantage of the method according to the invention that the transition from the first to the second region in the obtained nanowires is very sharp. This is important, for example, if the transition is a p-n junction and/or if electroluminescence is desired.

The first material may differ from the second material in a number of respects. In a first embodiment, the first and the second material comprise the same semiconductor but different dopings. This leads to internal pn junctions or, if so desired, pnp junctions. In a second embodiment, the second material has a bandgap different from that of the first material. Examples are transitions from Si to SiGe, SiC, or ternary or quaternary compounds, junctions of InP and InAs, of GaAs and GaN or GaP, and other III-V, II-VI materials. In a third embodiment, the first material is a metal and the second material a semiconductor.

The first and in particular the second layer of the substrate may be formed in various ways. If the first material differs from the second material as regards its doping, so-termed delta dopings may be provided. Alternatively, the first and the second layer may be independently formed and subsequently joined together. Such joining techniques are known inter alia for the manufacture of SOI type substrates.

In a further embodiment, the second layer is formed by epitaxial growth of the second material on the first layer. Such an epitaxial growth yields very homogeneous layers with extremely sharp transitions, as is apparent, for example, from W. B. de Boer, *Adv. in Rapid Thermal and Integrated Processing* (Kluwer Press, 1996), 443–463, which publication is incorporated herein by reference. In addition, bonds with the first layer are formed during the epitaxial growth of monocrystalline material. The adhesion between the first and the second region in the nanowire will be excellent as a result. A further advantage of the embodiment is that epitaxial growth is an industrially familiar technique.

The semiconductor substrate may be etched by various techniques. In a first modification, dry etching or reactive ion etching is applied. Isolated patterns of small dimensions are defined in the patterned mask in this case; then the entire substrate is removed during etching with the exception of the portions lying under the isolated patterns, which portions will form the nanowires. The advantage of this embodiment is that said etching techniques are substantially insensitive to differences between the first and the second layer.

In a second modification, anodic etching is used. Openings are defined in the patterned mask in this case. Pores are formed under the openings during etching, which pores become wider owing to a suitable setting of the current density until only the nanowires remain between the pores. The anodic etching is suitable for semiconductor substrates in which the first and the second material differ to a comparatively low degree, for example only in doping.

In a yet further embodiment, a third layer of a third material is present in the semiconductor substrate, and the second layer lies sandwiched between the first layer and the third layer and has a thickness of at most 100 nm. To form the nanowires, etching takes place through the first, the second, and the third layer, such that the nanowires comprise the first region, the second region, and a third region of the third material. Functional wires with locally defined functions can be made with this embodiment of the invention. An example is a nanowire of Si in which a region of SiGe is present locally. The smaller bandgap of SiGe with respect to Si will cause the SiGe to attract electrons. The second region is substantially point-shaped here. It can function as a quantum dot in which information can be stored with high density in an efficient manner owing to the quantization present. Such a point-shaped source is furthermore highly suitable for use as an optoelectronic recombination center and as a laser for emitting radiation. In further modifications of this embodiment, desired structures can be defined in the wire. Examples are structures of alternating dopings or bandgaps, such as p-n-p-n-p . . . and Si—Ge—Si—Ge—Si . . . and InP—InAs—InP—InAs— . . . .

The nanowires are removed from the substrate in a preferred embodiment. They may then be dispersed, and provided on a substrate. The removal is for instance realized with ultrasonic vibration.

Alternatively, the nanowires are not removed, but the device is further constructed on the silicon substrate. It is then preferred that the substrate is etched in pattern suitable for the application. The nanowires may be encapsulated thereafter in an insulating matrix, for instance of glass, such as described in the non-prepublished application EP 02078262.9 (PHNL020716). This is particularly suitable for display application.

Nanowires with internal functions are known from Gudliksen et al., Nature, 415 (2002), 617–620. It is a disadvantage of the known nanowires that the transitions between a first region of a first material and a second region of a second material are gradual over a range of 15 to 20 nm. Such a transition is insufficiently sharp for applications at high frequencies or for the emission of light of a certain wavelength.

It is accordingly a second object of the invention to provide a nanowire with a first region of a first material and a second region of a second material which has a transition between the first region and the second region which is sharp on a substantially atomic scale.

It is a third object of the invention to provide an electronic device of the kind mentioned in the third paragraph with the nanowires according to the invention.

The second object is achieved in that the nanowire can be obtained by the method according to the invention.

The third object is achieved in that the nanowire according to the invention is present between the first and the second electrode.

Figure 1B:
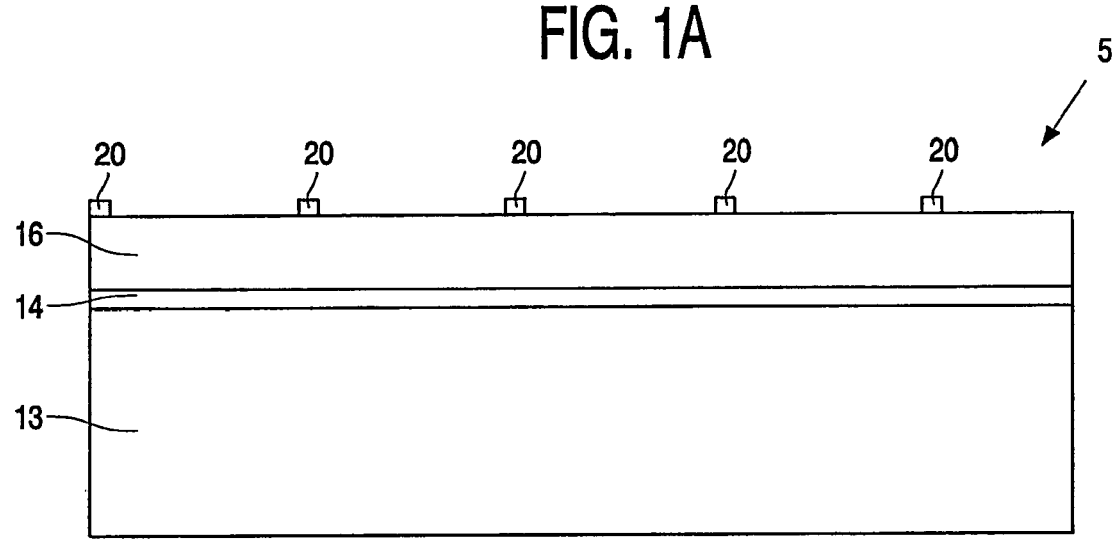
Figure 1C:
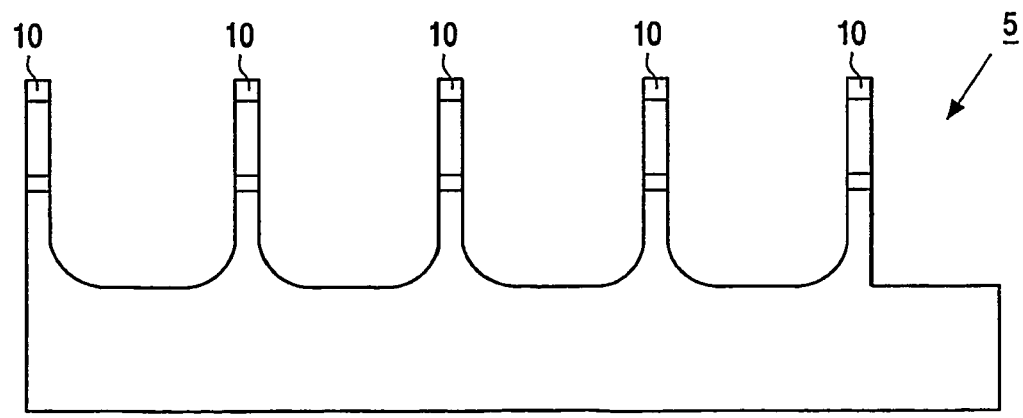
Figure 2A:
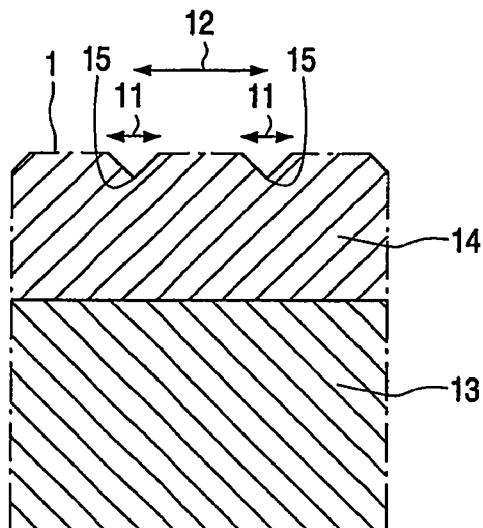
Figure 2B:
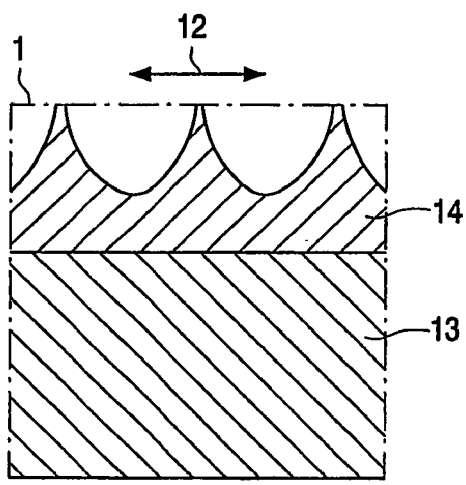
Figure 2C:
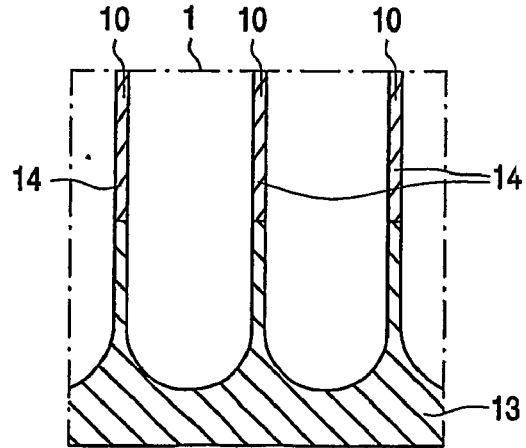
Figure 3:
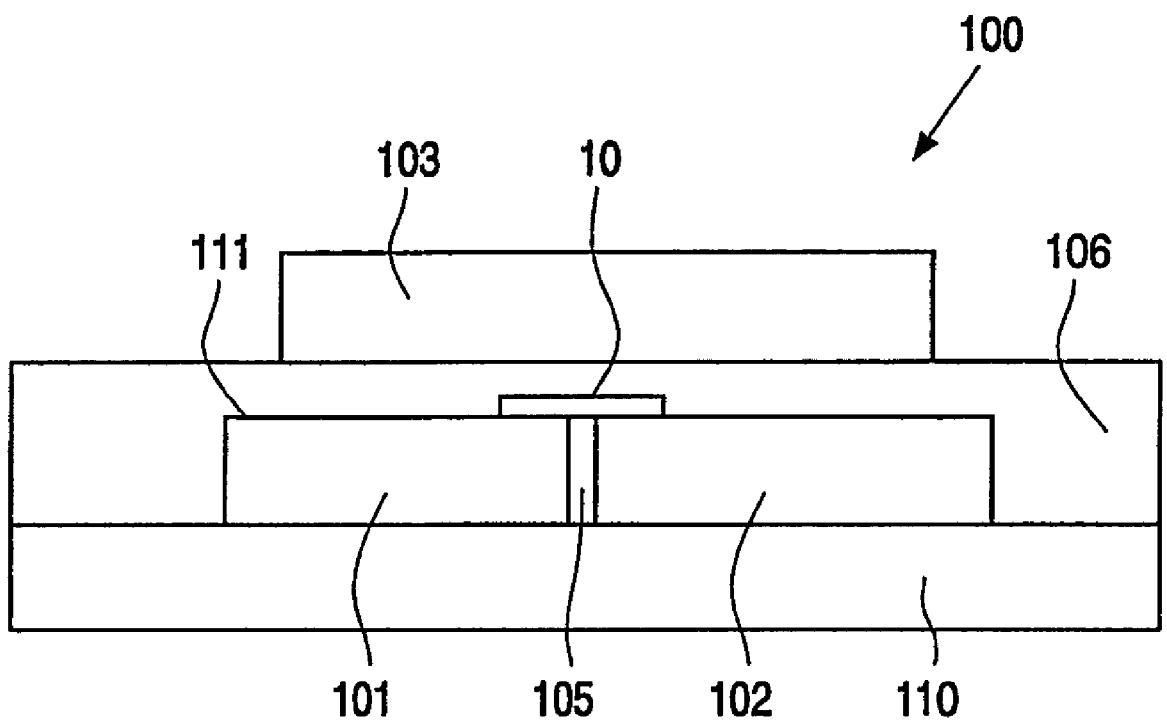

These and other aspects of the method, the nanowire, and the device according to the invention will be explained in more detail below with reference to embodiments and the drawing, in which:

FIGS. 1A to C show a first embodiment of the method;
FIGS. 2A to C show a second embodiment of the method, and
FIG. 3 is a diagrammatic cross-sectional view of the electronic device.

EMBODIMENT 1

FIG. 1 shows a first embodiment of the method according to the invention by which nanowires 10 are formed in a semiconductor substrate 5 by dry etching. FIG. 1A shows the semiconductor substrate 5 with a first layer 13 having an n-type doping, a second layer 14 having a p-type doping, and a third layer 16 having a n-type doping. FIG. 1B shows the semiconductor substrate 5 with an etching mask 20 at its surface 1. FIG. 1C shows the nanowires 10 formed after dry etching, before these nanowires 10 are detached from the substrate 5. This will be described in more detail below:

A second layer 14 of Si with a p-type doping is epitaxially grown on the first layer 13 with an n-type doping (doping level $10^{19}$ atoms/cm$^3$). The thickness of the second layer 14 is approximately 10 to 30 nm. A third layer 16 of Si with an n-type doping is epitaxially grown thereon. The thickness of the third layer 16 is approximately 200 nm.

A photosensitive double layer, comprising a 400 nm thick lower layer of hardbaked Shipley AZS1830 and a 80 nm thick top layer of a negative e-beam resist comprising silicones, is provided on the resulting semiconductor substrate 5 as shown in FIG. 1A. Said double layer is patterned by means of radiation (e-beam, 100 kV, 100 µC/cm$^2$), whereby isolated regions 20 are defined. These isolated regions 20 have a diameter of 50×50 nm and are mutually spaced apart by 0.5 µm. The top layer is developed for 20 seconds in xylene, followed by a dip in isopropyl alcohol for 30 seconds. Then the pattern is anisotropically transferred from the top layer to the lower layer by a 0.3 Pa oxygen plasma etch at a low rf power density of 0.07 W/cm$^2$ and a dc bias of −170 V.

The semiconductor substrate 5 is subsequently etched in a direction substantially perpendicular to the surface 1. This is done by dry etching with an inductively coupled plasma (ICP) setup, wherein an etching step and a passivating step are carried out in alternation. The treatment is rf-controlled (13.56 MHz). The gas mixture used for the etching step is $SF_6/O_2/C_4F_8$. Standard values are here a $SF_6$ gas flow of 130 sccm, an $O_2$ gas flow of 13 sccm, and a $C_4F_8$ gas flow of 40 sccm at a pressure of approximately 2 Pa. $C_4F_8$ is used as the gas for the passivating step at a gas flow rate of 140 sccm. The standard duration for an etching step and a passivating step is 8 seconds.

The semiconductor substrate 5 is etched to a depth of approximately 1.0 µm. Then the etching mask 20 is first removed. Subsequently, the semiconductor substrate 5 is heated in an oxygen atmosphere to approximately 850° C. for 2 hours. This causes a thermal oxidation of the silicon. The semiconductor substrate 5 is then placed in a bath with hydrogen fluoride in a concentration of approximately 5 mole per liter. A circulation is maintained in the bath so as to keep the composition of the bath constant. The result is that the nanowires 10 are given a diameter of 10 nm. The semiconductor substrate 5 with the nanowires 10 is placed in a bath of ethanol. This bath is placed in an ultrasonic device. The nanowires 10 are detached from the substrate 5 by means of ultrasonic vibrations. Nanowires 10 with internal n-p-n junctions are obtained in this manner.

The dispersion of the formed nanowires 10 is provided on a silicon substrate. Electrical contacts are photolithographically defined by means of electron beams (e-beams) in a double layer of 2 nm Ti and 10 nm Au. After the wires have been applied, heating takes place to 400° C.

EMBODIMENT 2

A semiconductor substrate 5 is manufactured with a first layer 13 having a p-type doping and a second layer 14 having an n-type doping. Nanowires 10 are formed from this semiconductor substrate 5 by anodic etching. Indentations 15 are for this purpose first provided in the surface 1, and the semiconductor substrate 5 is subsequently placed in an anodic cell. The rear surface 2 of the semiconductor substrate 5 is then present in a potassium sulphate solution so that this rear surface 2 is connected to an anode with electrical conduction. The surface 1 of the semiconductor substrate 5 is in a hydrogen fluoride solution. The nanowires 10 are finally detached from the semiconductor substrate 5 by ultrasonic vibration. Alternatively, a first layer 13 with an n-type doping and a second layer 14 with a p-type doping may be used. In that case the rear surface 2 of the semiconductor substrate 5 will be exposed.

FIG. 2A shows the semiconductor substrate 5 after indentations 15 have been provided at the front 1. The indentations 15 are formed from openings in a patterned etching mask previously provided. This etching mask is manufactured as follows: a 140 nm thick layer of $Si_3N_4$ and a photoresist are provided in that order on the substrate 5. Said photoresist is locally exposed through a mask in which holes of 1.5 µm diameter are present. The pitch 12 between the openings is 3.5 µm. The pitch is defined as the distance between the centers of two mutually adjoining openings. The photoresist is dissolved in the exposed locations, and the $Si_3N_4$ comes to the surface. The $Si_3N_4$ is etched with a preferably concentrated solution of $H_3PO_4$. The photoresist is then removed in an oxygen plasma. The semiconductor substrate 5 is placed for 8 minutes in an 8.8 mole KOH bath of 70° C. The KOH bath thus etches away the semiconductor substrate 5 of Si along the fast (100) crystal direction, whereas the slow (111) crystal direction remains substantially unaffected. In this manner, more than a billion pyramid-shaped pointed indentations 15 of substantially identical shape are defined in the surface 1 of the semiconductor substrate 5 of 150 mm diameter. The pattern formed thereby is that of a hexagonal grid.

FIG. 2B shows the semiconductor substrate 5 after a period of anodic etching. For this etching, the temperature, the HF concentration, and the applied potential are set to values such that the current density is in excess of 90% of the peak current density $i_{ps}$. This is the case, for example, in a bath with a HF concentration of 3.0 M and a temperature of 30° C. at a current density of 130 mA/cm². Etching was found to take place isotropically in a first phase. Then the etching continues anisotropically.

FIG. 2C shows the semiconductor substrate in a further stage. The result is that nanowires 10 are obtained after the pores have overlapped. The length of the nanowires 10 may be set for a desired value of between 1 and 100 µm, or even longer. This is set through the choice of the etching time. An etching time of approximately 20 minutes was necessary at the above settings for obtaining nanowires 10 of 100 µm length. The nanowires 10 are obtained with diameters of 50 and 80 µm, and greater. The diameter may be reduced through thermal oxidation of the nanowires 10 at approximately 800° C. and etching away of the resulting $SiO_2$ in a HF solution. The number of nanowires 10 obtained on one semiconductor substrate 5 is more than two billions ($2.10^9$).

EMBODIMENT 3

A surface of a first layer 13 with Si as its first material is cleaned at 900° C. by dipping the surface in HF. A second layer 14 is grown at 625° C. by means of chemical vapor deposition of a $H_2/SiH_2Cl_2/GeH_4$ gas mixture. The second layer 14 is grown at atmospheric pressure in a standard commercially available reactor for epitaxy. The second material of the second layer is $Si_xGe_{1-x}$, where x is dependent on the mutual concentrations of the $SiH_2Cl_2$ and $GeH_4$ in the gas mixture. Preferably, $0.4 \leq x \leq 0.6$. The second layer is provided to a thickness of 30 nm. Then a third layer 16 of Si is epitaxially grown in the same reactor by changing the gas mixture to $H_2/SiH_2Cl_2$. The third layer 16 is grown to a thickness of 400 nm. An etching mask 20 is subsequently provided on the semiconductor substrate 5 as described in embodiment 1. The result is a nanowire 10 of Si with an internal dot of SiGe.

EMBODIMENT 4

FIG. 2 is a diagrammatic cross-sectional view of a semiconductor element 100, which is a thin-film transistor. A source electrode 101 and a drain electrode 102 are provided on a polyimide substrate 110. The electrodes 101, 102 comprise, for example, Au and are defined by lithographic means. The electrodes 101, 102 are separated by a channel 105 which comprises a dielectric material, preferably with a low dielectric constant. Suitable materials are known to those skilled in the art, among them silicon dioxide, hydrogen silsesquioxane and methyl silsesquioxane, porous silica, SiLK, and benzocyclobutene. The choice of material also depends on the choice of substrate. The surface 11 of the electrodes 101, 102 and the channel 105 is planarized, so that nanowires 10 are present on a substantially planar surface 111. The nanowires 10 are laid down and aligned in that a droplet of a dispersion comprising the nanowires is provided on the surface 111 with simultaneous application of a voltage. The applied AC voltage of more than 25 V at a frequency of 1 kHz causes an alignment of nanowires 10. A dielectric layer 106 separating the gate electrode 103 from the nanowires 10 is present on the nanowires 10. Alignment may alternatively take place in that a mold with channels is provided on the surface 111, and the entire assembly is placed in a bath with the dispersion of nanowires. A flow is induced by means of a pressure difference, which sucks the nanowires into the channels of the mold. This leads to a positioning of aligned nanowires 10.

As will be obvious to those skilled in the art, an electronic device will preferably comprise a large number of semiconductor elements 100 which are interconnected in a desired pattern so as to form a circuit. It is further noted that a large number of nanowires 10 may be present in a single semiconductor element 100, and that various materials may be chosen for the substrate 110, the electrodes 101, 102, 103, and the dielectric layers 105, 106, as is known to those skilled in the art of thin-film transistors.

The invention claimed is:

1. A method of manufacturing nanowires, comprising the steps of providing a patterned etching mask at a surface of a semiconductor substrate, and etching the semiconductor substrate so as to form nanowires In a direction substantially perpendicular to the surface of the semiconductor substrate, characterized in that the semiconductor substrate comprises a first layer of a first material, second layer of a second material, and a third layer of the first material, the second layer sandwiched between the first and third layers; and etching takes place through the first, second and third layers for forming the nanowires such that the nanowires comprise a first region of the first material, a second region of the second material and a third region of the first material.

2. A method as claimed in claim 1, characterized in that the first and the second material comprise the same semiconductor but different dopings.

3. A method as claimed in claim 1, characterized in that the second layer is formed by epitaxial growth of the second material on the first layer.

4. A method as claimed in claim 3, characterized in that the first material comprises Si, and the second material is chosen from the group comprising SiC, SiGe, and SiGeC.

5. A method as claimed in claim 1, characterized in that the second layer has a thickness of at most 100 nm.

6. A method as claimed in claim 1, wherein the nanowires are removed from the substrate after the etching of the substrate.

* * * * *